(12) United States Patent
Masumoto et al.

(10) Patent No.: US 7,796,098 B2
(45) Date of Patent: Sep. 14, 2010

(54) LIGHT EMITTING DEVICE

(75) Inventors: Ken-ichi Masumoto, Hirakata (JP); Tetsuroh Nakamura, Takaraduka (JP)

(73) Assignee: Panasonic Corporation, Osaka (JP)

( * ) Notice: Subject to any disclaimer, the term of this patent is extended or adjusted under 35 U.S.C. 154(b) by 702 days.

(21) Appl. No.: 10/534,821

(22) PCT Filed: Nov. 10, 2003

(86) PCT No.: PCT/JP03/14277

§ 371 (c)(1), (2), (4) Date: May 13, 2005

(87) PCT Pub. No.: WO2004/045251

PCT Pub. Date: May 27, 2004

(65) Prior Publication Data

US 2006/0158400 A1 Jul. 20, 2006

(30) Foreign Application Priority Data

Nov. 13, 2002 (JP) .............................. 2002-329198

(51) Int. Cl.
*G09G 3/30* (2006.01)
*G09G 3/32* (2006.01)
(52) U.S. Cl. .......................................... 345/76; 345/82
(58) Field of Classification Search ................ 345/82, 345/76
See application file for complete search history.

(56) References Cited

U.S. PATENT DOCUMENTS

| 5,714,968 | A | | 2/1998 | Ikeda |
| 5,723,950 | A | * | 3/1998 | Wei et al. ................. 315/169.3 |
| 5,940,053 | A | | 8/1999 | Ikeda |
| 6,011,529 | A | | 1/2000 | Ikeda |
| 6,429,837 | B1 | | 8/2002 | Ishizuka et al. |
| 6,486,607 | B1 | * | 11/2002 | Yeuan ..................... 315/169.1 |

(Continued)

FOREIGN PATENT DOCUMENTS

JP 6-301355 10/1994

(Continued)

OTHER PUBLICATIONS

"Development Strategy for Organic EL Element", published by Kabushiki Kaisha Science Forum, published on Jun. 30, 1992, pp. 87-91 (with English translation).

(Continued)

*Primary Examiner*—Amare Mengistu
*Assistant Examiner*—Robert R Rainey
(74) *Attorney, Agent, or Firm*—Wenderoth, Lind & Ponack, L.L.P.

(57) ABSTRACT

A light emitting device is provided which is capable of feeding a reverse current to the defective structural part of a light emitting element, e.g. an organic EL element, without using the power supply voltage as reverse bias. The light emitting device comprises a capacitive light emitting element, e.g. an organic EL element, emitting light upon application of a DC forward voltage. A reverse current can be fed to the light emitting element through a low-resistance defective structural part, for example, only by connecting both electrodes of the organic EL element with the earth after stopping application of the DC forward voltage using a push-pull circuit (5), thereby discharging residual charges of the light emitting element.

4 Claims, 12 Drawing Sheets

U.S. PATENT DOCUMENTS

| | | | |
|---|---|---|---|
| 2001/0055458 A1* | 12/2001 | Ladd | 385/129 |
| 2002/0050962 A1 | 5/2002 | Kasai | |
| 2003/0098829 A1* | 5/2003 | Chen et al. | 345/82 |
| 2005/0041002 A1 | 2/2005 | Takahara et al. | |

FOREIGN PATENT DOCUMENTS

| | | |
|---|---|---|
| JP | 8-54835 | 2/1996 |
| JP | 11-161219 | 6/1999 |
| JP | 11-198433 | 7/1999 |
| JP | 11-305727 | 11/1999 |
| JP | 2001-83924 | 3/2001 |
| JP | 2002-189448 | 7/2002 |
| WO | 03/023750 | 3/2003 |

OTHER PUBLICATIONS

Office Action (with English translation) issued Jan. 20, 2010 in corresponding Japanese Application No. 2004-551211.

* cited by examiner

TO DRIVE CIRCUIT OF
NEXT STAGE

A          B

TO DRIVE CIRCUIT OF
NEXT STAGE

LIGHT EMITTING DEVICE

TECHNICAL FIELD

The invention relates to a light emitting device provided with a capacitive light emitting element, such as an organic light emitting element utilizing organic Electroluminescence, and available to a light source or a display unit for forming an electrostatic latent image on a photosensitive conductor of an image forming apparatus, or the like.

BACKGROUND ART

As exemplified by Japanese laid-open publication No. 11-198433, an organic light emitting device is applied to a print-head for forming an image on a photo conductor of an image forming apparatus such as a printer, as well as to a display. The print-head 11, as shown in FIG. 9, is designed so that plural sets of an organic EL element drive circuit 9 and an organic EL element ELD are disposed in line abreast, with the number of sets being several thousand or more. One of the plural organic EL element drive circuits 9 has a configuration as shown in FIG. 10, for example.

Referring to FIG. 10, a work of the organic EL element drive circuit 9 will be explained here. Switching elements FET1, FET2, and FET3, and a capacitor CN, which are shown in FIG. 10, constitute a current copier circuit 4.

In this configuration, a current source 10 is set to a specific current value. A trigger signal terminal is set to the level 'H' to turn ON the switching elements FET2 and FET3. A lighting strobe signal terminal 3 is set to the level 'L' to turn OFF a switching element FET6. By sending an electric current from the current source 10 to the capacitor CN through the switching elements FET2 and FET3 for a specific time, the capacitor CN is charged with an electric charge necessary for lighting the organic EL element ELD. After that, the trigger signal terminal 2 and the lighting strobe signal terminal 3 are set to the level 'L' for a short time (until the electric charge is charged in the capacitors of all the organic EL element drive circuits 9 of the print-head 11), and the electric charge is retained in the capacitor.

Next, when the trigger signal terminal 2 is set to the level 'L' while the lighting strobe signal terminal 3 is set to the level 'H', the switching elements FET2 and FET3 are turned OFF while the switching element FET6 is turned ON, whereby the electric charge retained in the capacitor CN is flowed into the organic EL element, and the electric charge thus flowed lights the organic EL element ELD. At this time, the switching element FET1 apparently becomes the same condition as a diode, and the electric charge equivalent to that for the capacitor CN is flowed from the capacitor CN to the organic EL element ELD through the switching elements FET1 and FET6.

In addition, a power supply terminal 1 is connected with a plus power supply for driving the switching elements constituting the drive circuit. The switching element may be any one of A FET and a transistor.

For the printer, each organic EL element is lighted or extinguished by sending signals to each organic EL element of the print-head according to an input image, whereby an electrostatic latent image is formed on the photo conductor.

In case of the production of the organic EL element included in this light emitting device, regardless of the use of the light emitting device, there are occasions when a portion without emitting light, which is generally called a 'black spot', appears in the organic EL constituting the organic EL element ELD. In most cases, this is a portion where an organic EL layer becomes thin due to the injection of foreign substances in the production process. Since the portion has a very low electric resistance as compared with the other organic EL layer, the electric charge concentrates on this portion. Accordingly, if a current with a given value is fed hereto, it is hard to obtain the desired luminous intensity. Moreover, owing to the concentration of the electric charge, the black spot slowly destroys the organic EL layer surrounding itself, and this causes a sharp reduction of the luminous intensity in the course of time. In the worst case, it brings about a destruction of the organic EL element ELD.

To solve such problem, there is a suggestion such as organic EL element drive circuit 9 capable of applying a reverse bias to an organic EL element in order to destroy a defective structural part with a low-resistance and remove the black spot, as shown in FIGS. 11 and 12.

The circuit shown in FIG. 11A includes an electric potential switch circuit consisting of three switching elements, FET8, FET9, and FET10, as a reverse bias application circuit.

In this circuit, when the lighting signal terminal 6 is set to the level 'H', the switching elements FET7 and FET10 are turned ON while the switching elements FET8 and FET9 are turned OFF through an inverter INV. And at that time, a current IC1 for lighting the organic EL element ELD is flowed to the organic EL element through the switching elements FET7 and FET10, whereby the organic EL element ELD is lighted.

Subsequently, when the lighting signal terminal 6 is set to the level 'L', the switching elements FET7 and FET10 are turned OFF while the switching elements FET8 and FET9 are turned ON, as shown in FIG. 11B. And at that time, a cathode of the organic EL element ELD is connected to the plus power supply 1 through the switching element FET8. In addition, an anode of the organic EL element ELD is connected to the ground through the switching element FET9. Hereby, the organic EL element ELD is biased in reverse. If the organic EL element ELD has a failed structural part, a current IC2 suddenly flows through the failed structural part in a reverse direction to the current IC1 that flows from the cathode to the anode of the element.

In this way, the reverse electric field is applied to the organic EL element ELD from the plus power supply 1 through the switching elements FET8 and FET9, whereby the black spot structural part and the peripheral part burn out, and this prevents the failed part from extending any more. As a result, it is possible to ensure the luminous intensity of the organic EL element and to extend the life of the organic EL element.

The circuit shown in FIG. 12 includes a power supply switch circuit for switching from a plus power supply 7 to a minus power supply 8 in order to apply the reverse bias to the organic EL element.

In this circuit, when the lighting signal terminal 6 is set to the level 'H', the switching element FET11 is turned ON while the switching element FET12 is turned OFF thorough the inverter INV connected with the lighting signal terminal 6, as shown in FIG. 12A. Through the switching element FET11 thus turned ON, the current IC1 for lighting the organic EL element ELD is applied on the organic EL element ELD from the plus power supply 7.

Subsequently, when the lighting signal terminal 6 is set to the level 'L', the switching element FET11 is turned OFF while the switching element FET12 is turned ON though the lighting signal terminal 6, as shown in FIG. 12B. Through the switching element FET 12 thus turned ON, the anode of the organic EL element ELD is connected to the minus power supply 8, with the result that the reverse bias is applied on the organic EL element ELD. Also in this case, likewise, if the organic EL element ELD has a failed structural part, a current IC2 suddenly flows through the failed structural part in the reverse direction to the current IC1 that flows from the cathode to the anode of the element. If the power supply sources are switched, the black spot structural part can also burn out in the same way as the electric potential switch circuit.

However, the above-noted prior art needs a circuit to use the power supply voltage as the reverse bias like the electric potential switch circuit and the power supply switch circuit. In addition, since the reverse bias is applied forcibly on the organic EL element by the power supply, the reverse bias becomes excessive, which might destroy the light emitting element itself.

SUMMARY OF THE INVENTION

The present invention is suggested based on the above-mentioned considerations, and has an object to provide a light emitting device capable of feeding a reverse current to a failed structural part of a light emitting element such as an organic EL element, without using a power supply voltage as a reverse bias.

The invention adopts the following construction to achieve the above object. The light emitting device of the invention has a capacitive light emitting element like an organic EL element for emitting light by application of a DC forward voltage. The light emitting element is lighted or extinguished by application of the voltage or by stopping the application of the voltage. And only by discharging a residual electric charge in the light emitting element applied with the DC forward voltage after stopping the application, the reverse current is fed to the defective structural part with a low-resistance of the light emitting element.

Due to a sudden change of an electric potential after stopping the voltage application, the residual charge brings to a generation of a counter electromotive force in the light emitting element. Accordingly, at the time of discharging the residual charge, if the light emitting element has a failed structural part with a low resistance, the reverse current flows rapidly being concentrated on the failed structural part. As a result, there is no necessity for the light emitting element to use a power supply voltage as a reverse bias in order to eliminate the disadvantageous effect caused from the failed structural part. Since only the residual charge is used, there is no danger that the reverse current becomes excessive enough to destroy the light emitting element.

A circuit, in order to feed the reverse current to the light emitting element after application of the DC forward voltage, may only connect respective electrodes of the light emitting element applied with the DC forward voltage with the earth, for example. If the light emitting element is an organic electro luminescence diode, both electrodes of the diode are connected to the earth. A use of such a circuit can reduce the circuit cost, simplify the control process, and downsize the apparatus along with extending the life of the light emitting element.

When the light emitting element is used as a light source for the printer and the display unit, the steps of applying of the DC forward voltage and stopping the application of the DC forward voltage are repeated in a specific cycle. In such a case, if both electrodes of the organic EL element are connected to the earth whenever the application stops, the failed structural part can burn out exactly before it grows up. As a result, the life of the organic EL element is extended considerably.

If both electrodes of the organic EL element are connected to the earth according to a signal for controlling the application of the DC forward voltage to the organic EL element, it is possible to easily prevent the short circuit caused from the concurrence of the connection to the earth and the voltage application. And it is also possible to eliminate the loss of the timing. In addition, the switching according to the signal for controlling the application of the DC forward voltage to the organic EL element, can be adaptable to the case where it is hard to adjust the timing for switching between the connection to the earth and the voltage application, for example, when the lighting-up time of one element varies from that of another element by using a PMW (Pulse Width Modulation) circuit for the gradation tone expression for plural elements. In such a case, the circuit for the switching may be prepared for each element. In a case where every element is lighted for a same time, like when the gradation tone expression of each element is performed by the current control or the voltage control, it is not necessary to prepare such switching circuit for each element.

On the contrary, according a signal different from the signal for controlling the application of the DC forward voltage to the organic EL element, both electrodes of the organic EL element can be connected to the earth. According to such a connection, it is possible to generate counter electromotive force in the organic EL element at an arbitrary time.

Moreover, while the DC forward voltage is not applied to the organic EL element, both electrodes of the organic EL element can be connected to the earth. In this case, since the organic EL element is always retained in a state of a short circuit, the element can be protected from the destruction caused from the noises and the accidental short circuit of power supply.

Hereinafter, preferred embodiments of the invention are explained according to the attached drawings. The following embodiments are only examples in which the invention is materialized, and they do not restrict the scope of the invention.

DETAILED DESCRIPTION OF THE INVENTION

Figure 1:
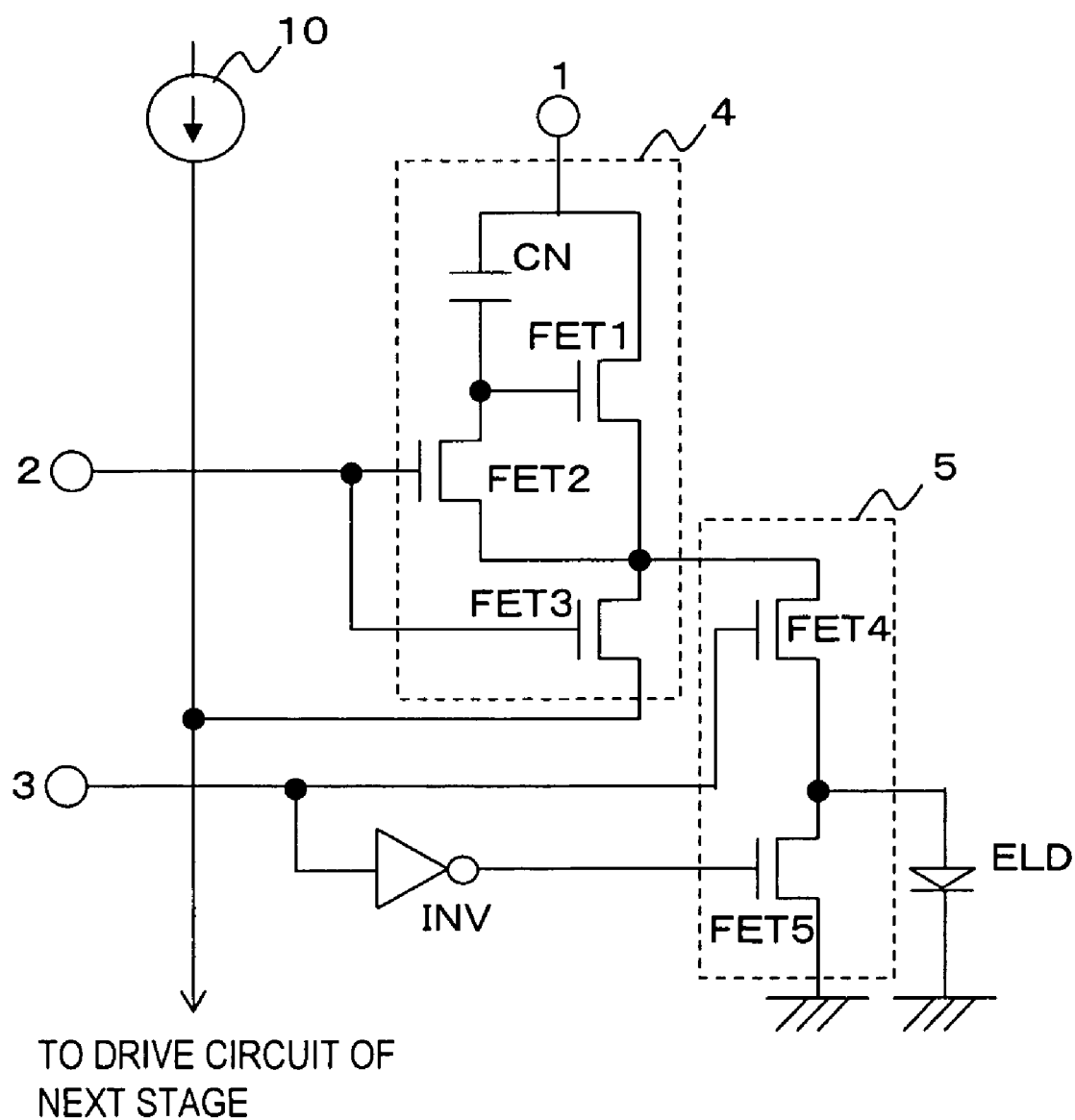
FIG. 1 is a schematic circuit diagram of an organic EL element drive circuit in an embodiment of the invention.
Figure 9:
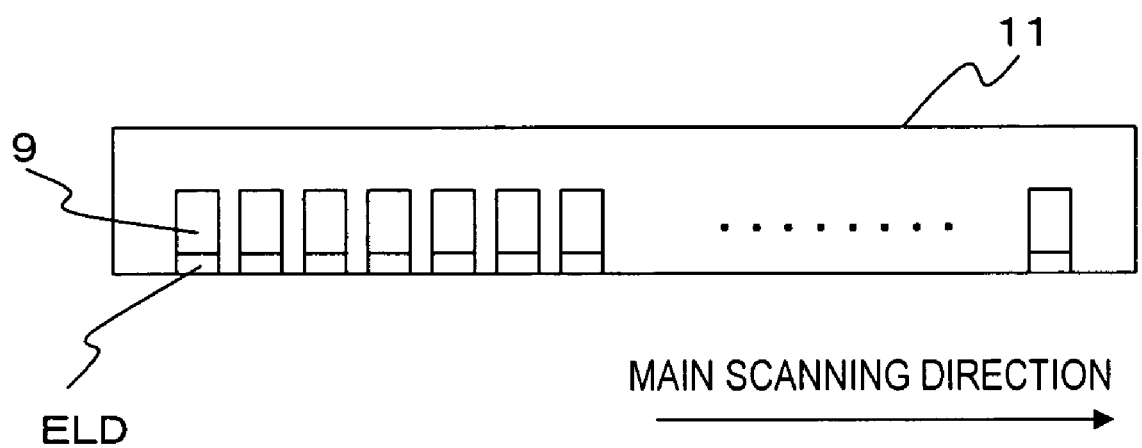
FIG. 9 is a schematic diagram of a print-head using the organic EL element.
Figure 10:
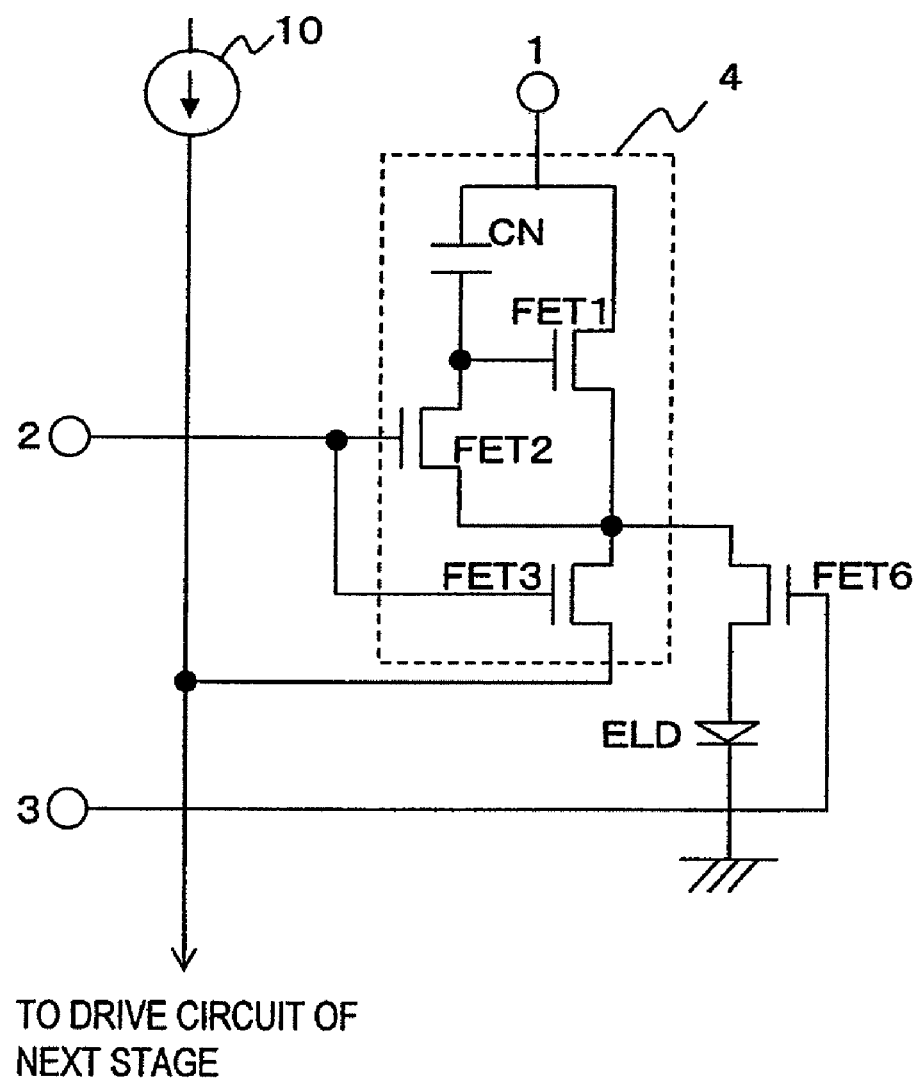
FIG. 10 is a schematic circuit diagram of a prior art organic EL element drive circuit t.
Figure 11:
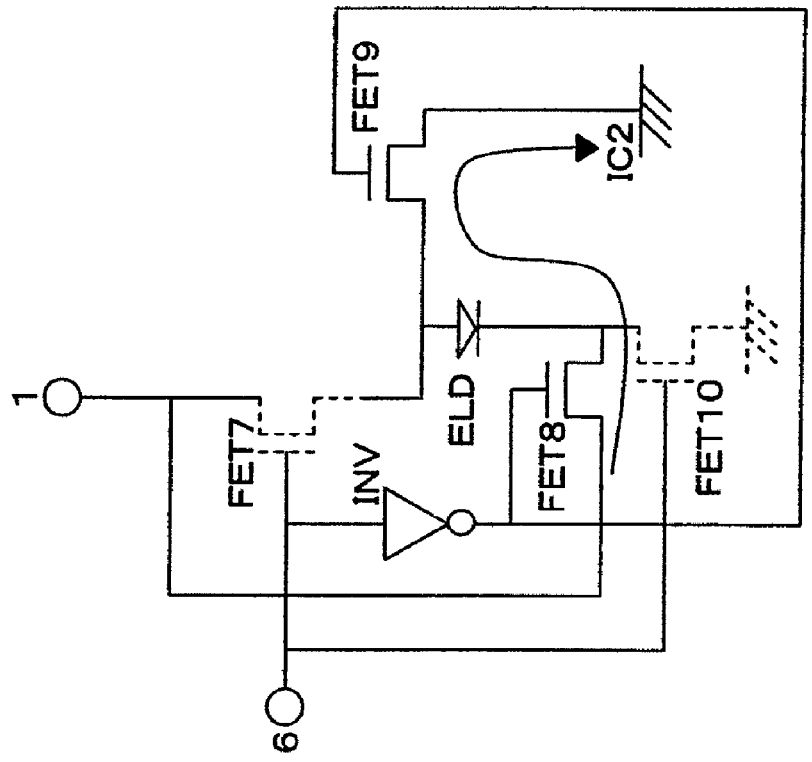
FIG. 11 is a schematic circuit diagram of a prior art electric potential switch circuit.
Figure 11:
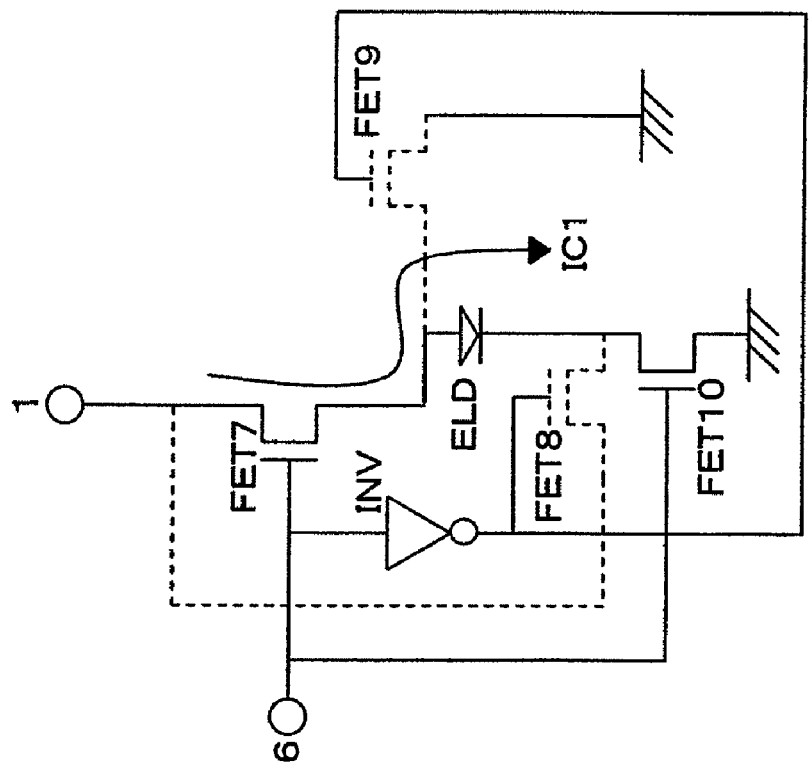
Figure 12:
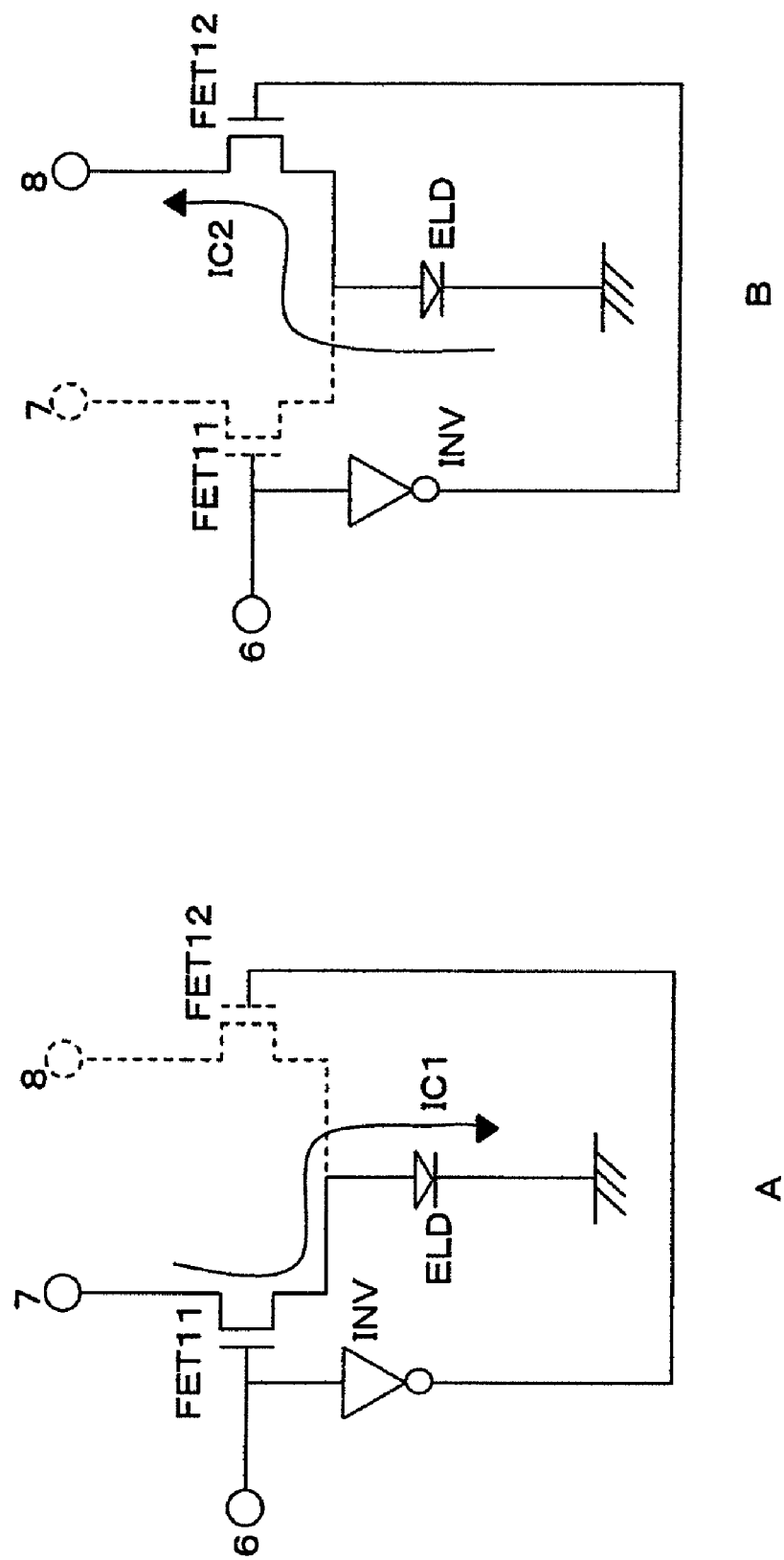
FIG. 12 is a schematic circuit diagram of a prior art power supply switch circuit.

In an embodiment of the present invention, a light emitting device is materialized as a print-head included in a printing system. The print-head has a plurality of organic EL elements ELD as a capacitive light emitting element, and by controlling the light and extinction of each organic EL element based on an input image, a latent image corresponding to the image can be formed on a photo conductor. Like the conventional art shown in FIG. 9, the print-head has plural sets of an organic EL element and the drive circuit 9, and one of those drive circuits is illustrated in FIG. 1.

A current for lighting the organic EL element ELD is fed from a current feeding circuit 4. In this embodiment, a current copier circuit is used for the current feeding circuit 4. The current copier circuit includes switching elements FET1, FET2, and FET3, and a capacitor CN as a capacitive element for accumulating an electric charge, like the conventional art. The work is also the same as the conventional art.

When the current copier circuit is used for the current feeding circuit 4, the electric charge accumulated in the capacitor CN is fed as a lighting current directly to the organic EL element ELD without the amplification. Accordingly, even if each element constituting the current copier circuit has a different property, it is possible to ensure the luminescence property without the influence of the dispersion.

In addition, in case of the print-head using the current copier circuit, while the electric charge is charged in the capacitor CN of the current copier circuit, when it is completed that the capacitors CN of all the current copier circuits are charged, the plural organic EL elements ELD can be lighted simultaneously by means of the same lighting strobe signal. In case of the print-head for the static lighting in such a way, the organic EL element is lighted at the same time as the other organic EL elements, with the result that, even if the photo conductor of the printer (e.g. the photo sensitive drum) moves, it is possible to write the latent image in a straight line along with the array direction of the organic EL elements (see FIG. 9, a main scanning direction). In this case, the straight line on the input image is always expressed on a printed sheet by a straight line. Therefore, it is possible to obtain the image having linearity superior to the lighting by a data shift method to send data for lighting to each organic EL element sequentially, and have each element emit light upon receipt of the data.

One end of the current feeding circuit 4 is connected with a push-pull circuit 5. The push-pull circuit 5 is provided with a first switching element FET4 and a second switching element FET5 that are cascaded. An end of the first switching element FET4 is connected with a connecting point of the switching elements FET1, FET2 and FET3 of the current copier circuit 4.

An anode of the organic EL element ELD is connected with a connecting point of the switching elements FET4 and FET5 of the push-pull circuit 5. A cathode of the organic EL element ELD and the other end of the push-pull circuit 5, i.e. FET5, are connected with the earth.

Figure 2:
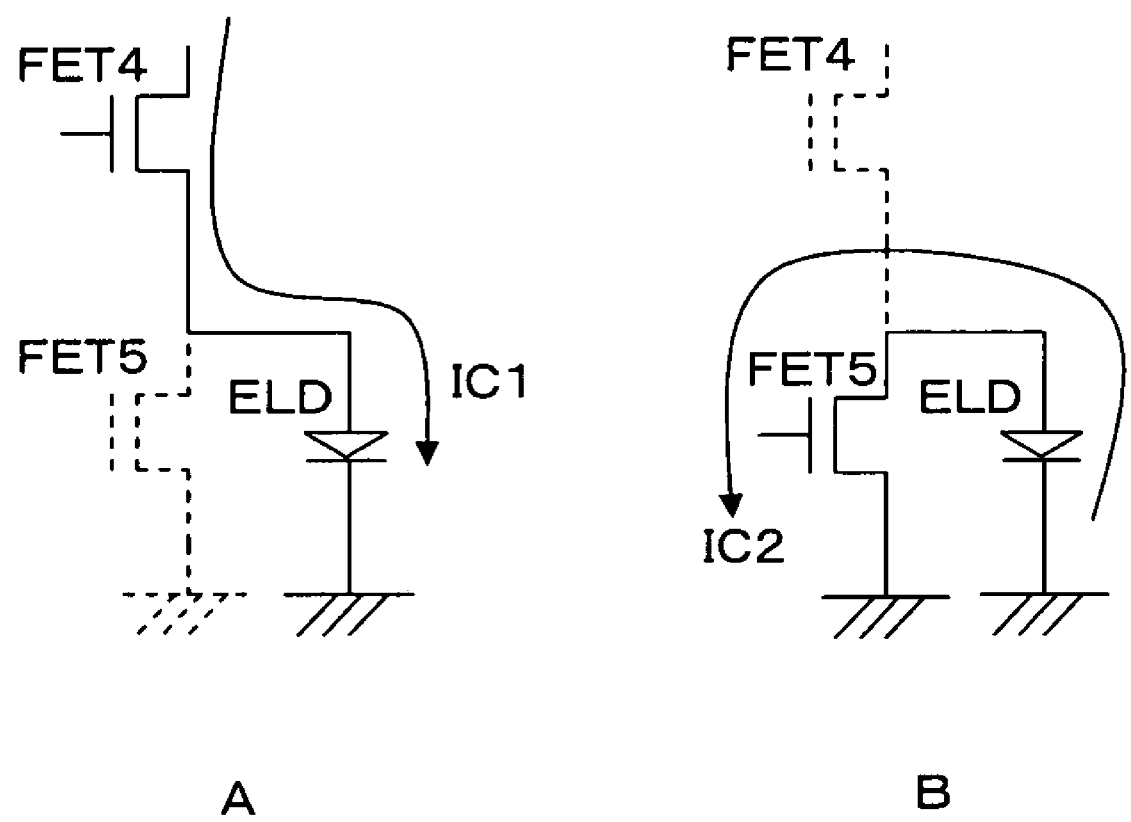
FIG. 2 is a circuit diagram of a push-pull circuit in this embodiment of the invention.

The current from the current feeding circuit 4 is fed to the organic EL element ELD through the push-pull circuit 5. As shown in FIG. 2A, the push-pull circuit 5 is configured such that, when the switching element FET4 is turned ON while the switching element FET5 is turned OFF, the current IC1 for lighting the organic EL element ELD is fed to the organic EL element ELD through the switching element FET4.

The control for turning ON or OFF the switching elements FET4 and FET5 is performed respectively through the lighting strobe signal terminal 3 and the inverter INV connected thereto. When the lighting strobe signal terminal 3 is set to the level 'H', the switching element FET 4 is turned ON while the switching element FET 5 is turned OFF through the inverter INV. Hereupon, a suitable DC forward voltage is applied between the anode and cathode of the organic EL element ELD, and the current IC1 flows into the organic EL element ELD through the switching elements FET1 and FET4.

Figure 3:
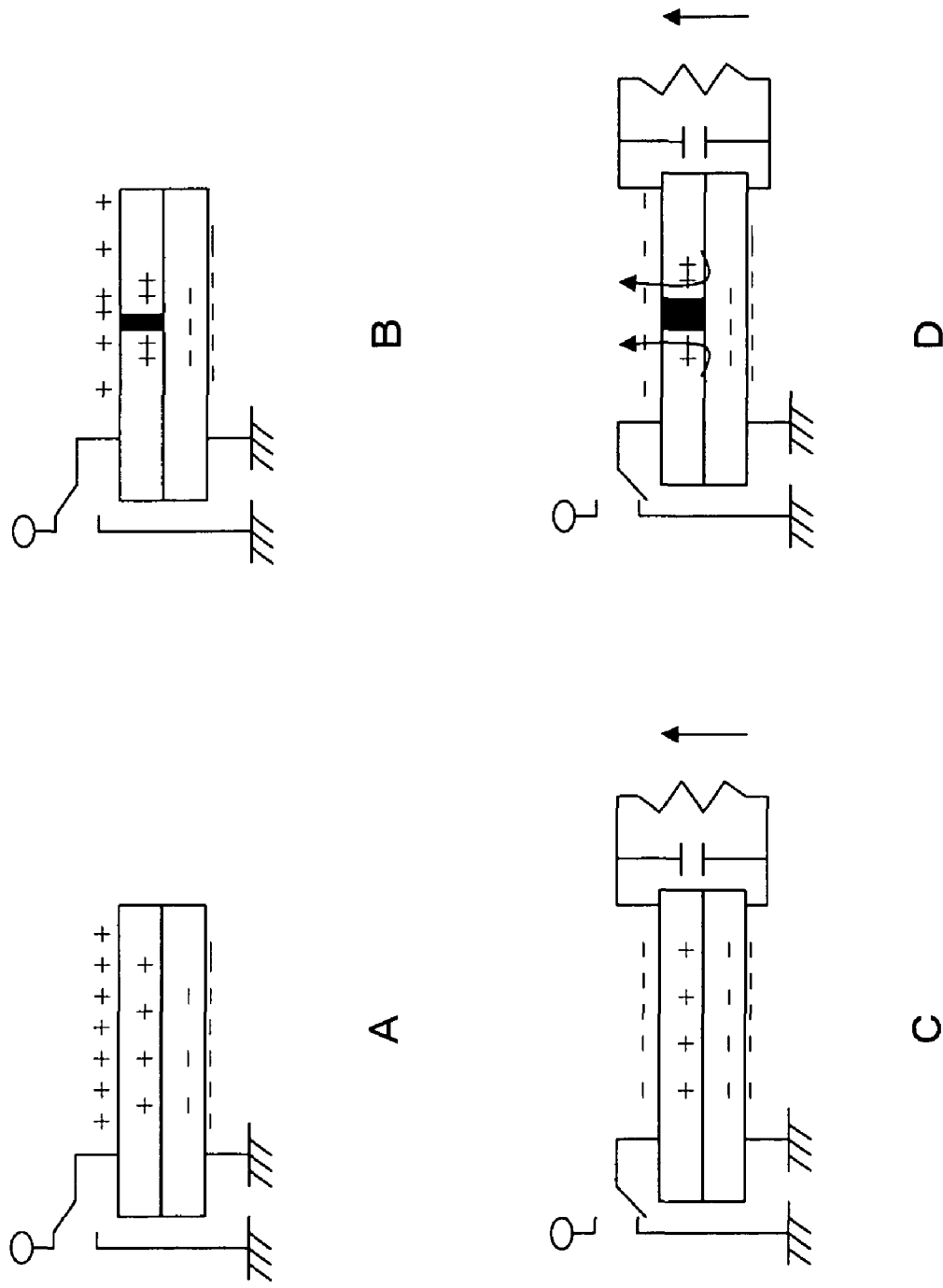
FIG. 3 is a diagram for explaining a phenomenon of the removal of the black spot on the organic EL element.

At this time, when the organic EL element ELD is normal without a black spot as shown in FIG. 3A, the organic EL element ELD is injected with carriers keeping the voltage corresponding to the capacity component of the organic EL element ELD, and the organic EL element ELD can emit the light with a desired luminance.

On the contrary, when the organic EL element ELD has a block spot as shown in FIG. 3B, even if the DC forward current is fed to the organic EL element ELD, the carriers concentrate around on the black spot having a low-resistance, also in case of the short-circuit state, and an excessive current flows through the organic EL element without emitting the light. Therefore, this may result in a necessary luminous intensity being unable to be obtained, or the organic EL elements not being able emit light any more, otherwise, in the worst case, there is a danger that the short-circuit might bring about the destruction of the circuit.

In order to eliminate such a bad influence of the black spot, the print-head in this embodiment is configured such that, after stopping the application of the DC forward voltage, the residual electrical charge in the organic EL element ELD is discharged, and only this allows the reverse current to flow into the organic EL element through a failed structural part.

In the print-head of the present embodiment, the above-mentioned control of lighting (and extinguishing) each organic EL element is performed in cycles of a specific time corresponding to the moving speed of the photo conductor, for example. Namely, the application of the DC forward voltage and the stop of the application are repeated.

When the lighting strobe signal terminal 3 becomes the 'L' level, the switching element FET4 is turned OFF while the switching element FET5 is turned ON through the inverter INV. At this time, the anode of the organic EL element ELD is connected to the earth through the switching element FET5, as shown in FIG. 2B.

Since both electrodes of the organic EL element are connected to the earth immediately after stopping the application of the voltage as described above, even if the electric potentials of the electrodes change suddenly, as long as the organic EL element ELD is normal, the electric charge accumulated in the organic EL element ELD cannot pursue the electric potential change and a counter electromotive force is generated due to the bias of the electric charge, as shown in FIG. 3C. And, since the inner resistance of the normal organic EL element ELD is large, the residual charge in the organic EL element ELD is discharged gradually spending time corresponding to the time constant defined by the inner resistance and the capacity component.

On the contrary, if the organic EL element ELD has a black spot, the resistance of the failed structural part becomes very low as compared with the other parts, so that the residual charge of the organic EL element ELD is rapidly discharged concentrating on the black spot and the periphery due to the counter electromotive force, as shown in FIG. 3D. And then, the reverse discharge current IC2 flows rapidly through the switching element FET5, as shown in FIG. 2B.

As a result, even if the power supply voltage is not used to the reverse bias, it is possible to burn the failed structural part out in the same way at the application of the reverse bias, and stop the progress of the destruction of the organic EL element ELD. And unlike the case where the reverse bias is forcefully applied, there is no possibility that the reverse current becomes excessive enough to destroy the element. Consequently, the life of the organic EL element ELD can be extended.

Figure 4:
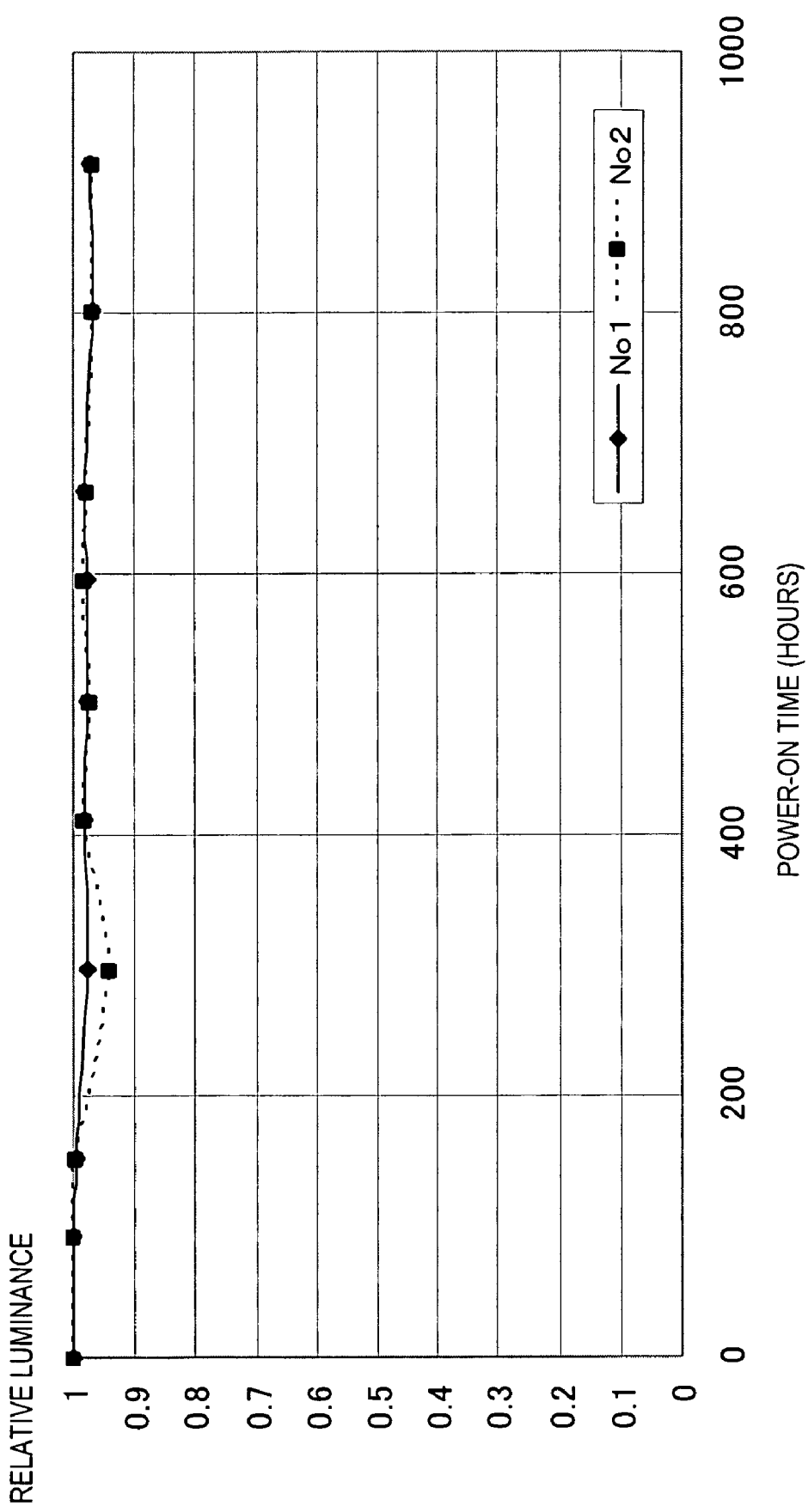
FIG. 4 is a diagram showing a life of an organic EL element to which the invention is applied.
Figure 5:
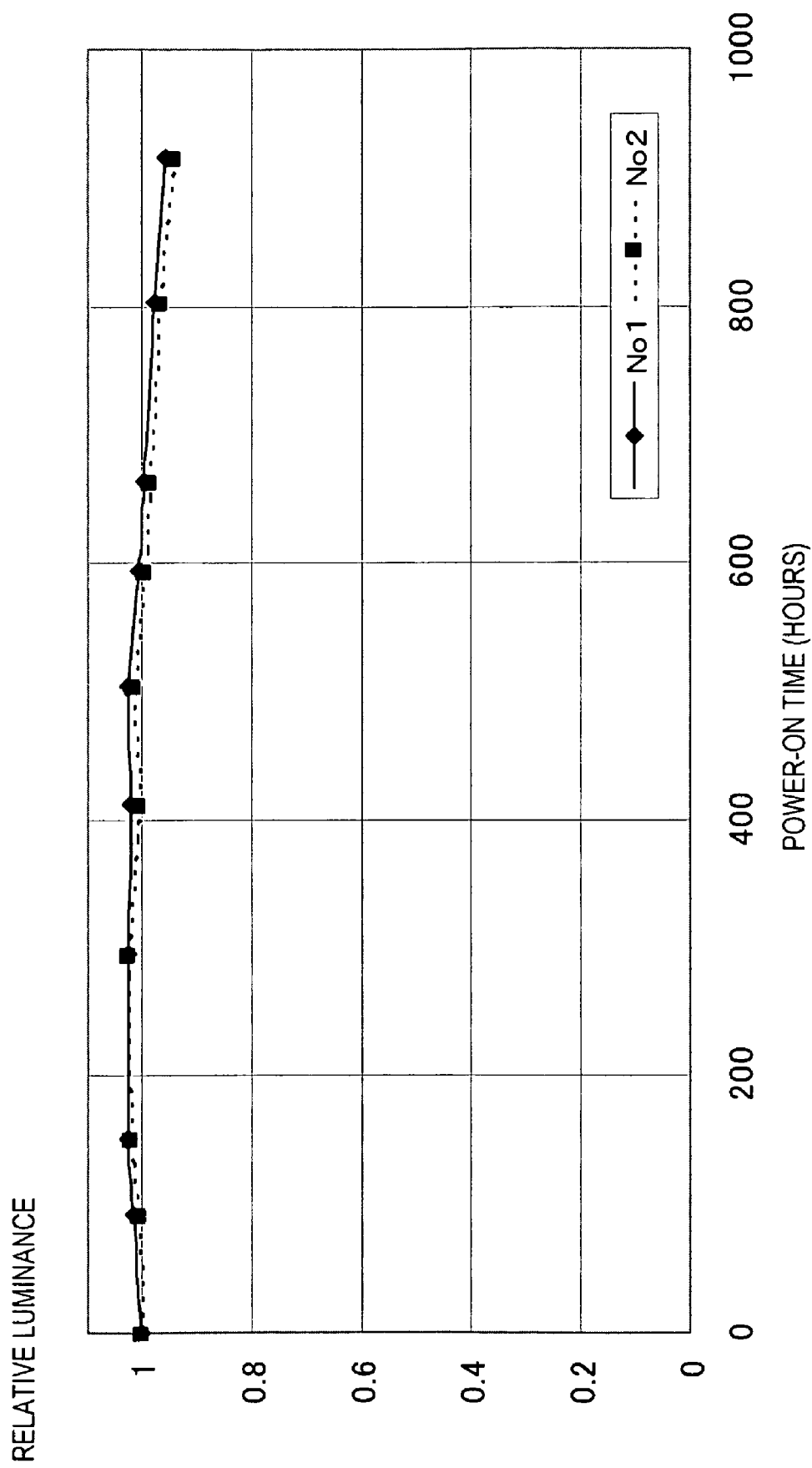
FIG. 5 is a diagram illustrating a life of an organic EL element to which the invention is not applied.
Figure 6:
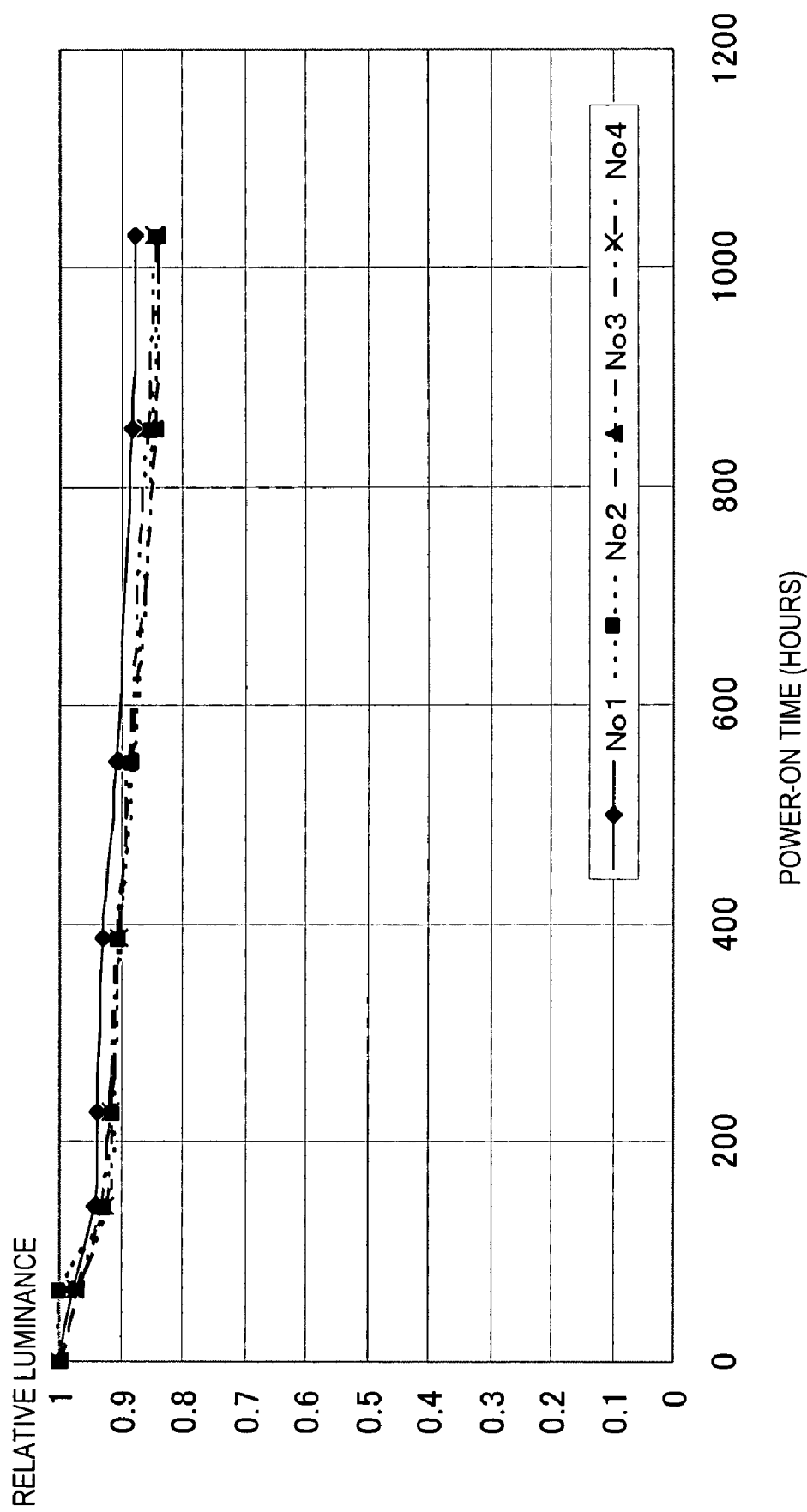
FIG. 6 is another diagram illustrating a life of an organic EL element to which the invention is applied.
Figure 7:
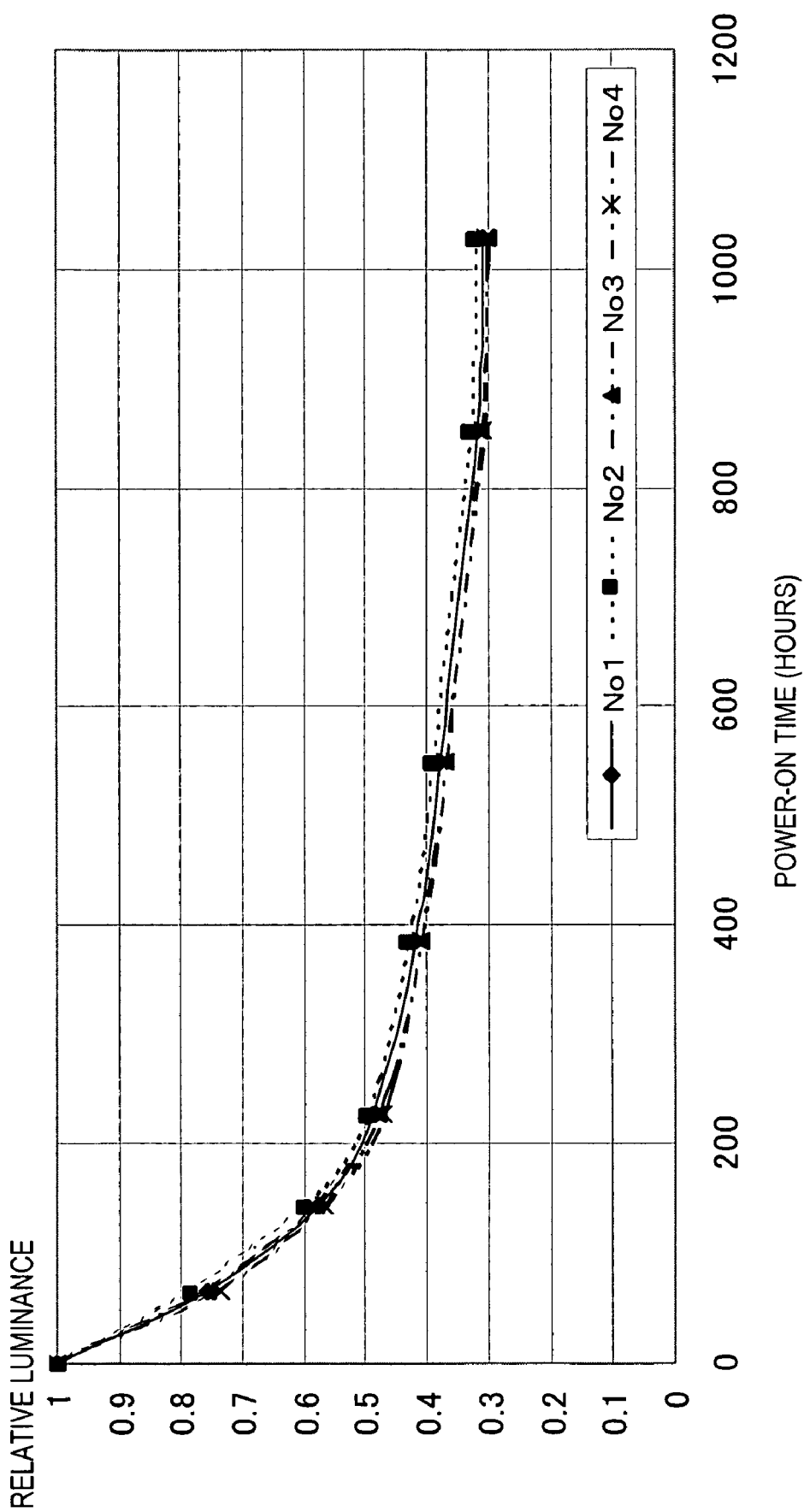
FIG. 7 is another diagram illustrating a life of an organic EL element to which the invention is not applied.

FIG. 4 and FIG. 5 are graphs showing the life of the organic EL element in which the push-pull circuit is used. FIG. 6 and FIG. 7 are graphs showing the life of the organic EL element in which the push-pull circuit is not used, and correspond to FIG. 4 and FIG. 5, respectively. The organic EL element shown in FIG. 4 and FIG. 6 has a different luminous color, i.e. a different material, from that shown in FIG. 5 and FIG. 7. A horizontal axis in FIGS. 4 to 7 indicates a power-on time (h), and a vertical axis indicates a relative luminance to the luminance when the power-on time is 0.

As evidenced by the drawings, if the failed structural part is not destroyed, the relative luminance of the organic EL element decreases as the power-on time goes on. Particularly in an example shown in FIG. 7, the relative luminance is less than 0.5 when the power-on time is over 200 hours. As compared with this, where the failed structural part is destroyed by means of the push-pull circuit as mentioned above, even if the power-on time is over 900 hours, the luminance hardly decreases at all. Under the condition of the destroyed failed structural part that is different from the condition of the undestroyed failed structural part, it is possible to understand that the life of the organic EL element is extended significantly without using the power supply voltage as a reverse bias.

The light emitting luminance of the organic EL element is concerned not only with the existence of the failed structural part, but also with the degree of the growth of the failed structural part, as described above. In this embodiment, both electrodes of the organic EL element ELD are connected with the earth according to the lighting strobe signal 3, so that the connection is established whenever the application of the DC forward voltage to the organic EL element ELD stops. By connecting both electrodes of the organic EL element ELD with the earth whenever the application of the DC forward voltage stops, the failed structural part can exactly burn out before the failed structural part grows. In addition, according to the lighting strobe signal 3, while the DC forward voltage is not applied on the organic EL element ELD, both electrodes of the organic EL element ELD are being connected with the earth. By connecting both electrodes of the organic EL element with the earth while the DC forward voltage is not applied on the organic EL element ELD, the organic EL element ELD can always be kept in a condition of the short-circuit when the organic EL element does not emit light. Accordingly, the element can be protected from the destruction caused from noises and abrupt short-circuits of the power supply.

In a case where both electrodes of the organic EL element are connected with the earth according to a signal for controlling the application of the DC forward voltage to the organic EL element ELD, like the lighting strobe signal 3, the connection to the earth and the application of the voltage are changed according to the same signal. Accordingly, it is possible to easily and simply prevent the short circuit of the applied voltage caused from the concurrence of the earth connection and the voltage application. And it is also possible to eliminate the timing loss. In case of using a circuit capable of switching between the connection to the earth and the application of the voltage according to the same signal, like the push-pull circuit 5, it is possible to use various circuits as the current supply circuit 4. When the lighting-up time of one element varies from that of another element by using PWM circuit for performing the gradation tone expression for plural elements, it is hard to adjust the time for switching between the connection to the earth and the voltage application. Even in such case, the switching according to the signal for controlling the application of the DC forward voltage to the element can be performed by preparing the circuit for switching each element.

Without using the lighting strobe signal 3 as a signal for the on-off control of the switching elements FET4 and FET5 constituting the push-pull circuit, the on-off control of the switching element FET5 may be performed according to a different signal from the lighting strobe signal 3. In this case, since the control is performed according to the independent signal different from the lighting strobe signal 3, both electrodes of the organic EL element ELD can be connected to the earth at an arbitrary time. And the connection to the earth always needs not to be established whenever the application of the DC forward voltage stops. The establishment time of the connection may be determined based on the characteristics of the organic EL element.

In the above-mentioned example, the switching elements FET4 and FET5 are configured as one channel structure, e.g. N-channel type. However, for instance, if the switching element FET4 is N-channel type while the switching element FET5 is P-channel type, the inverter INV can be eliminated.

The above-mentioned example explains that the organic EL element performs the static lighting by means of the capacitive element of the current copier circuit, however, it is of course possible that the light emitting device of the invention may adopt the data-shift method. In the data-shift method, the data for the lighting is sent to each organic EL element of the print-head 11 in sequence, and upon receipt of the data, the each organic EL element starts emitting light immediately. The circuit does not need to have a function to retain the data, so that it is possible to simplify the circuit. However, this causes a time-lag of the lighting-up time between the respective organic EL elements, strictly speaking. A straight line becomes a non-straight line and it is drawn as a slant line on the printed matter (because of the moving of the recording paper, for example).

Figure 8:
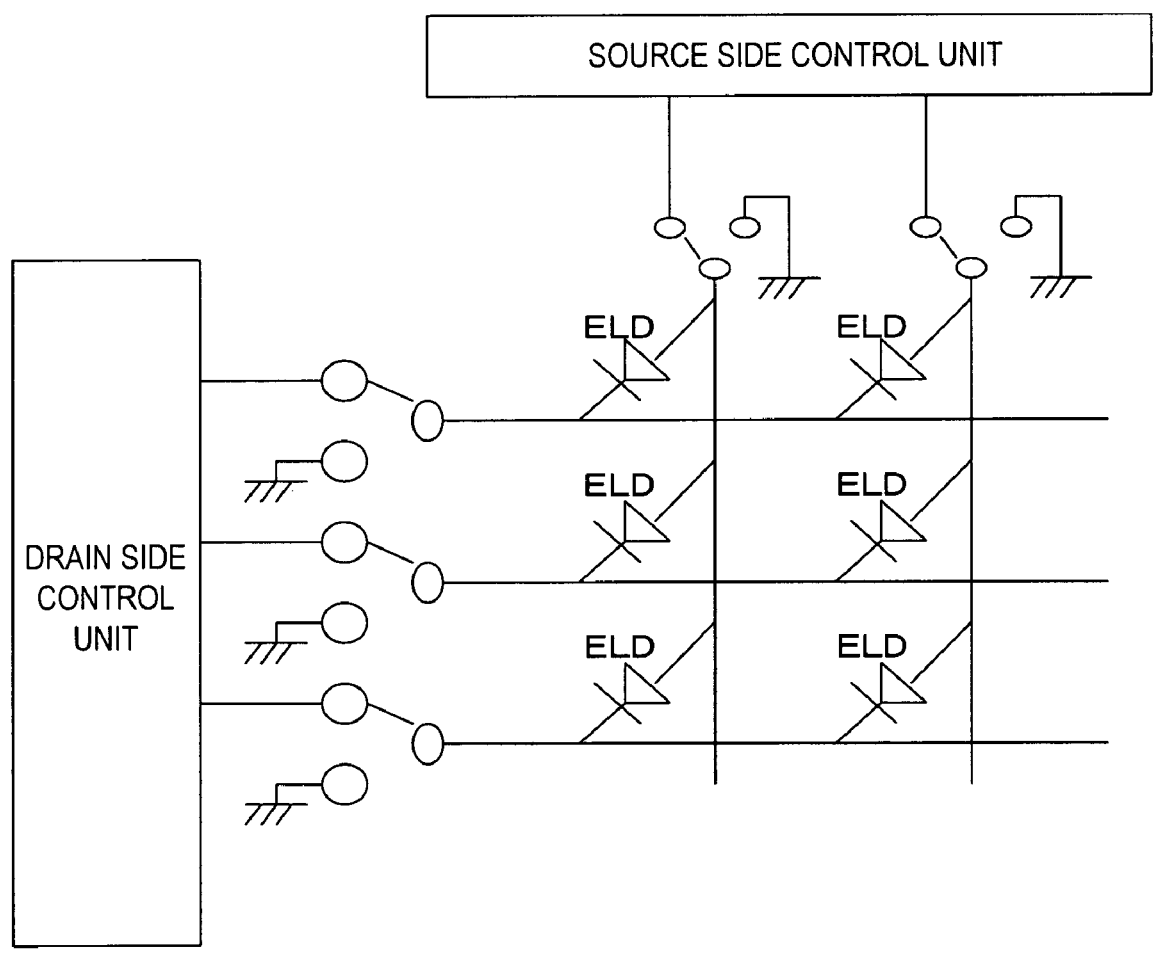
FIG. 8 is a diagram illustrating an example of the disposal of organic EL elements when the invention is applied to a display unit.

Moreover, the above example explains about a case where the invention is applied to the print-head, but the invention can be applied to another light emitting device such as a display. In case of the display, plural organic EL elements are disposed in matrix as shown in FIG. 8, and an image can be displayed by controlling the lighting and extinction of each element according to the data of image. When each element performs the gradation tone expression, it is general that the gradation tone expression per element is executed by the voltage control or the current control while the lighting and extinction of the elements are executed simultaneously. In this case, the push-pull circuit does not need to be prepared for each element. As shown in FIG. 8, a push-pull circuit can placed in a power supply unit on source side of a display matrix for each source side line, and in a power supply unit on drain side for each drain side line. Hereby, the residual charge of each element can be discharged at the change from the lighting to the extinction.

In the above example, the current copier circuit is used as the power supply circuit 5. When the push-pull circuit 4 is combined with a current mirror circuit having the current amplification function, even though the organic EL element ELD deteriorates due to a lapse of time, the current mirror circuit can apply a large volume of current on the organic EL element. Therefore, it is possible to obtain a stable luminescence characteristic. However, as previously stated, a circuit provided with PMW circuit may be used as the power supply circuit, the other circuits with a current mirror circuit, a circuit with a data latch circuit and a DA converter, or the like, can be used as the power supply circuit.

The above-mentioned configuration employs a two-circuit structure using PNP and NPN elements as the switching element. However, if the switching can be made, a one-circuit structure may be employed using an analog switch, and a structure with three or more circuits may be adopted, too. For instance, the switching element can employ the three-circuit structure which includes two NPN elements and an inverter.

INDUSTRIAL APPLICABILITY

The light emitting device of the invention has an effect that the reverse current can be fed to the failed structural part of a light emitting element such as an organic EL element without using the power supply voltage as the reverse bias, and is available for a light source of the printer and the display unit, or the like.

The invention claimed is:

1. A light emitting device comprising:
   a current feeding circuit;
   a push-pull circuit including a first switching element and a second switching element that are cascaded;
   an organic electro luminescence element having an anode connected with a connecting point of the first switching element and the second switching element, and a cathode connected with the earth;
   a lighting strobe signal terminal connected to the first switching element and the second switching element, the lighting strobe signal terminal outputting a lighting strobe signal to the first switching element and the second switching element; and
   an inverter positioned between the lighting strobe signal terminal and the second switching element, the inverter turning off the second switching element when the lighting strobe signal indicates that the first switching element is turned on, and the inverter turning on the second switching element when the lighting strobe signal indicates that the first switching element is turned off,
   wherein an end of the push-pull circuit is connected with the current feeding circuit, and another end of the push-pull circuit is connected with the earth, the current feeding circuit feeding a current to the organic electro luminescence element through the first switching element,
   wherein a residual electric charge in the organic electro luminescence element is charged when the first switching element is turned on, the second switching element is turned off, and a DC forward voltage is applied to the organic electro luminescence element, and
   wherein the residual electric charge in the organic electro luminescence element is discharged when the first switching element is turned off and the second switching element is turned on, and after the application of the DC forward voltage to the organic electro luminescence element is stopped, the discharge of the residual electric charge resulting in a reverse current that is fed to the organic electro luminescence element through a defective part of the organic electro luminescence element, the defective part of the organic electro luminescence element having a low resistance.

2. The light emitting device as defined in claim 1, wherein a signal different from the lighting strobe signal is utilized for controlling the application of the DC forward voltage to the organic electro luminescence element.

3. The light emitting device as defined in claim 1, wherein the current feeding circuit includes a capacitive element for accumulating an electric charge supplied by a power supply terminal, and a lighting current is fed to the organic electro luminescence element through the first switching element from the capacitive element of the current feeding circuit when the first switching element is turned on and the second switching element is turned off.

4. The light emitting device as defined in claim 3, wherein the organic electro luminescence element performs static lighting by charging the capacitive element of the current feeding circuit with the electric charge when the first switching element is turned off.

* * * * *